(12) United States Patent
Tauzin et al.

(10) Patent No.: US 7,670,930 B2
(45) Date of Patent: Mar. 2, 2010

(54) METHOD OF DETACHING A THIN FILM BY MELTING PRECIPITATES

(75) Inventors: Aurélie Tauzin, Saint Egreve (FR); Bruce Faure, Grenoble (FR); Arnaud Garnier, Grenoble (FR)

(73) Assignees: Commissariat a l'Energie Atomique, Paris (FR); S.O.I. Tec-Silicon on Insulator Technologies, Bernin (FR)

( * ) Notice: Subject to any disclaimer, the term of this patent is extended or adjusted under 35 U.S.C. 154(b) by 0 days.

(21) Appl. No.: 12/293,193
(22) PCT Filed: Mar. 28, 2007
(86) PCT No.: PCT/FR2007/000534
§ 371 (c)(1), (2), (4) Date: Sep. 16, 2008
(87) PCT Pub. No.: WO2007/110515
PCT Pub. Date: Oct. 4, 2007

(65) Prior Publication Data
US 2009/0061594 A1    Mar. 5, 2009

(30) Foreign Application Priority Data
Mar. 29, 2006  (FR) .................... 06 51088

(51) Int. Cl.
H01L 21/46   (2006.01)
H01L 21/31   (2006.01)
H01L 21/469  (2006.01)
(52) U.S. Cl. ..................... 438/458; 438/766
(58) Field of Classification Search ............ 438/458, 438/766; 257/E21.568
See application file for complete search history.

(56) References Cited

U.S. PATENT DOCUMENTS 4,028,149 A    6/1977 Deines et al.

(Continued)

FOREIGN PATENT DOCUMENTS

EP    0 410 679 A1    1/1991

(Continued)

OTHER PUBLICATIONS

Almeida et al., "Bond formation in ion beam synthesized amorphous gallium nitride", Elsevier, This Solid Films 343-344, pp. 632-636, 1999.

(Continued)

*Primary Examiner*—William M. Brewster
(74) *Attorney, Agent, or Firm*—Brinks Hofer Gilson & Lione

(57) ABSTRACT

A method of fabricating a thin film from a substrate includes implantation into the substrate, for example made of silicon, of ions of a non-gaseous species, for example gallium, the implantation conditions and this species being chosen, according to the material of the substrate, so as to allow the formation of precipitates confined in a certain depth, distributed within a layer, these precipitates being made of a solid phase having a melting point below that of the substrate. The method optionally further including intimate contacting of this face of the substrate with a stiffener, and detachment of a thin film by fracturing the substrate at the layer of precipitates by applying a mechanical and/or chemical detachment stress under conditions in which the precipitates are in the liquid phase.

32 Claims, 1 Drawing Sheet

U.S. PATENT DOCUMENTS

| | | |
|---|---|---|
| 4,254,590 A | 3/1981 | Eisele et al. |
| 4,956,698 A | 9/1990 | Wan |
| 5,242,863 A | 9/1993 | Xiang-Zheng et al. |
| 5,300,788 A | 4/1994 | Fan et al. |
| 5,374,564 A | 12/1994 | Bruel |
| 5,400,458 A | 3/1995 | Rambosek |
| 5,405,802 A | 4/1995 | Yamagata et al. |
| 5,559,043 A | 9/1996 | Bruel |
| 5,811,348 A | 9/1998 | Matushita et al. |
| 5,854,123 A | 12/1998 | Sato et al. |
| 5,877,070 A | 3/1999 | Goesele et al. |
| 5,909,627 A | 6/1999 | Egloff |
| 5,920,764 A | 7/1999 | Hanson et al. |
| 5,953,622 A | 9/1999 | Lee et al. |
| 5,966,620 A | 10/1999 | Sakaguchi et al. |
| 5,993,677 A | 11/1999 | Biasse et al. |
| 5,994,207 A | 11/1999 | Henley et al. |
| 6,013,563 A | 1/2000 | Henley et al. |
| 6,020,252 A | 2/2000 | Aspar et al. |
| 6,048,411 A | 4/2000 | Henley et al. |
| 6,054,370 A | 4/2000 | Doyle |
| 6,071,795 A | 6/2000 | Cheung et al. |
| 6,103,597 A | 8/2000 | Aspar et al. |
| 6,103,599 A | 8/2000 | Henley et al. |
| 6,127,199 A | 10/2000 | Inoue |
| 6,146,979 A | 11/2000 | Henley et al. |
| 6,150,239 A | 11/2000 | Goesele et al. |
| 6,190,998 B1 | 2/2001 | Bruel et al. |
| 6,225,190 B1 | 5/2001 | Bruel et al. |
| 6,225,192 B1 | 5/2001 | Aspar et al. |
| 6,271,101 B1 | 8/2001 | Fukunaga |
| 6,303,468 B1 | 10/2001 | Aspar et al. |
| 6,323,108 B1 | 11/2001 | Kub et al. |
| 6,323,109 B1 | 11/2001 | Okonogi |
| 6,346,458 B1 | 2/2002 | Bower |
| 6,362,077 B1 | 3/2002 | Aspar et al. |
| 6,513,564 B2 | 2/2003 | Bryan et al. |
| 6,534,380 B1 | 3/2003 | Yamauchi et al. |
| 6,593,212 B1 | 7/2003 | Kub et al. |
| 6,607,969 B1 | 8/2003 | Kub et al. |
| 6,727,549 B1 | 4/2004 | Doyle |
| 6,756,286 B1 | 6/2004 | Moriceau et al. |
| 6,770,507 B2 | 8/2004 | Abe et al. |
| 6,774,010 B2 | 8/2004 | Chu et al. |
| 6,946,365 B2 | 9/2005 | Aspar et al. |
| 7,439,092 B2 * | 10/2008 | Tauzin ............... 438/46 |
| 2002/0025604 A1 | 2/2002 | Tiwari |
| 2002/0153563 A1 | 10/2002 | Ogura |
| 2002/0185684 A1 | 12/2002 | Campbell et al. |
| 2003/0077885 A1 | 4/2003 | Aspar et al. |
| 2003/0134489 A1 | 7/2003 | Schwarzenbach et al. |
| 2003/0162367 A1 | 8/2003 | Roche |
| 2003/0199105 A1 | 10/2003 | Kub et al. |
| 2004/0058537 A1 * | 3/2004 | Yanagita et al. ............ 438/689 |
| 2004/0144487 A1 | 7/2004 | Martinez et al. |

FOREIGN PATENT DOCUMENTS

| | | |
|---|---|---|
| EP | 0 293 049 B1 | 9/1993 |
| EP | 0 786 801 A1 | 7/1997 |
| EP | 0 793 263 A2 | 9/1997 |
| EP | 0 801 419 A1 | 10/1997 |
| EP | 0 807 970 A1 | 11/1997 |
| EP | 0 917 193 A1 | 5/1999 |
| EP | 0 938 129 A1 | 8/1999 |
| EP | 0 533 551 A1 | 3/2000 |
| EP | 0 902 843 B1 | 3/2000 |
| EP | 0 994 503 A1 | 4/2000 |
| EP | 1 050 901 A2 | 11/2000 |
| EP | 0 717 437 B1 | 4/2002 |
| EP | 0 767 486 B1 | 1/2004 |
| EP | 0 925 888 B1 | 11/2004 |
| EP | 1 014 452 B1 | 5/2006 |
| FR | 2 681 472 A1 | 3/1993 |
| FR | 2 748 850 A1 | 11/1997 |
| FR | 2 748 851 A1 | 11/1997 |
| FR | 2 758 907 A1 | 7/1998 |
| FR | 2 767 416 A1 | 2/1999 |
| FR | 2 773 261 A1 | 7/1999 |
| FR | 2 774 510 A1 | 8/1999 |
| FR | 2 781 925 A1 | 2/2000 |
| FR | 2 796 491 | 1/2001 |
| FR | 2 797 347 | 2/2001 |
| FR | 2 809 867 | 12/2001 |
| FR | 2 847 075 A1 | 5/2004 |
| JP | 58 31519 | 2/1983 |
| JP | 62265717 | 11/1987 |
| JP | 101004013 | 1/1989 |
| JP | 07-254690 | 10/1995 |
| JP | 7-302889 | 11/1995 |
| JP | 09-213594 | 8/1997 |
| JP | 09-307719 | 11/1997 |
| JP | 11045862 | 2/1999 |
| JP | 11074208 | 3/1999 |
| JP | 11087668 | 3/1999 |
| JP | 11-145436 | 5/1999 |
| JP | 11-233449 | 8/1999 |
| WO | WO 99/08316 A1 | 2/1999 |
| WO | WO 99/35674 A1 | 7/1999 |
| WO | WO 99/39378 A1 | 8/1999 |
| WO | WO 00/48238 A1 | 8/2000 |
| WO | WO 00/63965 A1 | 10/2000 |
| WO | WO 01/11930 A2 | 2/2001 |
| WO | WO 02/47156 A1 | 6/2002 |
| WO | WO 02/083387 A1 | 10/2002 |
| WO | WO 03/013815 A1 | 2/2003 |
| WO | WO 2004/044976 A1 | 5/2004 |

OTHER PUBLICATIONS

Dhara et al., "Mechanism of nanoblister formation in Ga+ self-ion implanted GaN nanowires", Applied Physics Letters, vol. 86, No. 20, p. 203199, Sep. 1 to 3, 2005.

Jones et al., "Enhanced elimination of implantation damage upon exceeding the solid solubility", J. Appl. Phys. 62(10), pp. 4114-4117, Nov. 15, 1987.

Matsuo et al., "Abnormal solid solution and activation behavior in GA-implanted Si(100)", Appl, Phys. Lett., 51 (24) pp. 2037-2039, Dec. 14, 1987.

Sunkara et al., "Bulk synthesis of silicon nanowires using a low-temperature vapor-liquid-solid solution", Applied Physics Letters, vol. 79, No. 10, pp. 1546-1548, Sep. 3, 2001.

PCT International Search Report, dated Nov. 22, 2007.

PCT Written Opinion in French, dated Nov. 22, 2007.

PCT Request in French, dated Mar. 28, 2007.

U.S. Office Action in U.S. Application No. 10/534,199; Mailing Date Feb. 19, 2009.

U.S. Office Action in U.S. Application No. 10/534,199; Mailing Date Aug. 15, 2009.

U.S. Office Action in U.S. Application No. 11/747,733; Mailing Date Mar. 16, 2009.

U.S. District Court District of Delaware (Wilmington) Civil Docket for Case #: 1:08-cv-00292-SLR — (19 pgs).

Complaint filed with Jury Demand against MEMC Electronic materials Inc.—Magistrate Consent Notice to Pltf. ( Filing fee $350, receipt number 152004.)—filed by SOITEC Silicon On Insulator Technologies SA, Commissariat a LEnergie Atomique. (Attachments: # 1 Exhibit 1, # 2 Exhibit 2, # 3 Exhibit 3, # 4 Civil Cover Sheet, # 5 Acknowledgement of Consent Form) (Sns, ) (Entered: May 20, 2008) (47 pgs).

Notice of Availability of a U.S. Magistrate Judge to Exercise Jurisdiction (sns, ) (Entered: May 20, 2008) (1 pg).

Report to the Commissioner of Patents and Trademarks for Patent/ Trademark Number(s) RE39,484 E; 6,809,009; 7,067,396 B2; (sns, ) (Entered: May 20, 2008) (1 pg).
Summons Returned Executed by SOITEC Silicon On Insulator Technologies SA, Commissariat a LEnergie Atomique. MEMC Electronic Materials Inc. served on May 19, 2008, answer due Jun. 9, 2008. (Kraft, Denise) (Entered: May 20, 2008) (2 pgs).
Motion for Pro Hac Vice Appearance of Attorney George W. Neuner, Alan M. Spiro, Brian M. Gaff and Carolyn D'Agincourt—filed by SOITEC Silicon On Insulator Technologies SA, Commissariat a LEnergie Atomique. (Attachments: # 1 Certificate of Compliance Certification by Counsel To Be Admitted Pro Hac Vice, # 2 Certificate of Compliance Certification by Counsel To Be Admitted Pro Hac Vice, # 3 Certificate of Compliance Certification by Counsel To Be Admitted Pro Hac Vice, # 4 Certificate of Compliance Certification by Counsel To Be Admitted Pro Hac Vice, # 5 Certificate of Service)(Kraft, Denise) (Entered: May 23, 2008) (6 pgs).
Stipulation to Extend Time Answer to Complaint to Jul. 9, 2008—filed by MEMC Electronic Materials Inc.. (Rogowski, Patricia) (Entered: Jun. 05, 2008) (1 pg).
Motion for Pro Hac Vice Appearance of Attorney Robert M. Evans, Jr., David W. Harlan, Richard L. Brophy, Marc W. Vander Tuig—filed by MEMC Electronic Materials Inc.. (Attachments: # 1 Certification of Robert M. Evans, Jr., # 2 Certification of David W. Harlan, # 3 Certification of Richard L. Brophy, # 4 Certification of Marc W. Vander Tuig)(Rogowski, Patricia) (Entered: Jun. 09, 2008) (6 pgs).
Motion for Pro Hac Vice Appearance of Attorney Michael L. Brody, Richard P. Gilly, Gail J. Standish, Marcus T. Hall and Jason S. Charkow—filed by SOITEC Silicon On Insulator Technologies SA. (Attachments: # 1 Certification By Counsel to be Admitted Pro Hac Vice, # 2 Certification By Counsel to be Admitted Pro Hac Vice, # 3 Certification By Counsel to be Admitted Pro Hac Vice, # 4 Certification By Counsel to be Admitted Pro Hac Vice, # 5 Certification By Counsel to be Admitted Pro Hac Vice)(Kraft, Denise) (Entered: Jun. 10, 2008) (8 pgs).
Disclosure Statement pursuant to Rule 7.1 filed by SOITEC Silicon On Insulator Technologies SA, Commissariat a LEnergie Atomique. (Attachments: # 1 Certificate of Service)(Kraft, Denise) (Entered: Jun. 16, 2008) (3 pgs).
Motion to Dismiss Based upon or, in the Alternative, Motion for a More Definite Statement—filed by MEMC Electronic Materials Inc.. (Rogowski, Patricia) (Entered: Jul. 09, 2008) (4 pgs).
Opening Brief in Support re 10 Motion to Dismiss Based upon or, in the Alternative, Motion for a More Definite Statement filed by MEMC Electronic Materials Inc..Answering Brief/Response due date per Local Rules is Jul. 28, 2008. (Rogowski, Patricia) (Entered: Jul. 09, 2008) (15 pgs).
Disclosure Statement pursuant to Rule 7.1 filed by MEMC Electronic Materials Inc.. (Rogowski, Patricia) (Entered: Jul. 09, 2008) (3 pgs).
Answering Brief in Opposition re 10 Motion to Dismiss Based upon or, in the Alternative, Motion for a More Definite Statement filed by Commissariat a LEnergie Atomique.Reply Brief due date per Local Rules is Aug. 7, 2008. (Attachments: # 6 Exhibit A, # 7 Exhibit B, # Certificate of Service) (Kraft, Denise) (Modified on Jul. 29, 2008 (lid). (Entered: Jul. 28, 2008) (29 pgs).
Sealed Reply Brief re 10 Motion to Dismiss Based upon or, in the Alternative, Motion for a More Definite Statement filed by MEMC Electronic Materials Inc.. (Rogowski, Patricia) (Entered: Aug. 07, 2008) Redacted Reply Brief re 14—re 10 Motion to Dismiss Based upon or, in the Alternative, Motion for a More Definite Statement filed by MEMC Electronic Materials Inc.. (Attachments: # 1 Exhibit 2, # 2 Exhibit 3, # 3 Exhibit 4, # 4 Exhibit 5, # 5 Unreported Cases, # 6 Certificate of Service) (Rogowski, Patricia) Modified on Aug. 8, 2008 (lid). (Entered: Aug. 07, 2008) (98 pgs).
Memorandum Order denying 10 Motion to Dismiss Based upon or, in the Alternative, Motion for a More Definite Statement filed by MEMC Electronic Materials Inc., Order, Setting Hearings Telephonic Scheduling Conference set for Mar. 12, 2009 at 9:00 A.M. Signed by Judge Sue L. Robinson on Feb. 20, 2009. (nmf) (Entered: Feb. 20, 2009) (6 pgs).
Motion for Pro Hac Vice Appearance of Attorney B. Scott Eidson—filed by MEMC Electronic Materials Inc.. (Attachments: # 1 Exhibit Certification by Counsel to be Admitted Pro Hac Vice)(Rogowski, Patricia) (Entered: Feb. 23, 2009) (4 pgs).
Notice of Service of Plaintiffs' Initial Disclosures Pursuant to Fed. R. Civ. P. 26(a)(1) by SOITEC Silicon On Insulator Technologies SA, Commissariat a LEnergie Atomique. (Attachments: # 1 Certificate of Service) (Kraft, Denise) (Entered: Feb. 27, 2009) (4 pgs).
Answer to 1 Complaint, with Jury Trial Demanded, Counterclaim against all plaintiffs by MEMC Electronic Materials Inc.. (Attachments: # 1 Exhibit A)(Rogowski, Patricia) (Entered: Mar. 06, 2009) (55 pgs).
Notice of Service of MEMC Electronic Materials, Inc.'s Initial Disclosures by MEMC Electronic Materials Inc..(Rogowski, Patricia) (Entered: Mar. 06, 2009) (3 pgs).
Proposed Order Proposed Scheduling Order re 16 Memorandum and Order ,,Set Hearings, by SOITEC Silicon On Insulator Technologies SA, Commissariat a LEnergie Atomique. (Kraft, Denise) (Entered: Mar. 10, 2009) (7 pgs).
Letter to the Honorable Sue L. Robinson from Denise Seastone Kraft, Esq. regarding [Proposed] Scheduling Order—re 21 Proposed Order, 16 Memorandum and Order,, Set Hearings,. (Kraft, Denise) (Entered: Mar. 10, 2009) (1 pg).
Stipulation to Extend Time to Respond or Otherwise Plead to Defendant's Counterclaim to Apr. 7, 2009—filed by SOITEC Silicon On Insulator Technologies SA, Commissariat a LEnergie Atomique. (Attachments: # 1 Certificate of Service)(Kraft, Denise) (Entered: Mar. 11, 2009) (2 pgs).
Proposed Order Revised Scheduling Order re 21 Proposed Order, 16 Memorandum and Order,, Set Hearings, by SOITEC Silicon On Insulator Technologies SA, Commissariat a LEnergie Atomique. (Kraft, Denise) (Entered: Mar. 12, 2009) (7 pgs).
Letter to The Honorable Sue L. Robinson from Denise Seastone Kraft regarding Revised Scheduling Order Pursuant to Mar. 12, 2009 Telephonic Scheduling Conference—re 24 Proposed Order. (Kraft, Denise) (Entered: Mar. 12, 2009) (1 pg).
Scheduling Order: Case referred to the Magistrate Judge for the purpose of exploring Adr. Joinder of Parties due by Aug. 14, 2009. Amended Pleadings due by Aug. 14, 2009. Discovery due by Apr. 23, 2010. Discovery Conference set for Jun. 25, 2009 04:30 PM in Courtroom 6B before Judge Sue L. Robinson. Dispositive Motions due by Jun. 25, 2010. Answering Brief due Jul. 16, 2010. Reply Brief due Jul. 30, 2010. Oral Argument set for Aug. 27, 2010 09:30 AM in Courtroom 6B before Judge Sue L. Robinson. Claim Construction Opening Briefs due by Jun. 18, 2010. Response Briefs due Jul. 9, 2010. Final Pretrial Conference set for Oct. 14, 2010 04:30 PM in Courtroom 6B before Judge Sue L. Robinson. Jury Trial set for Oct. 25, 2010 09:30 AM in Courtroom 6B before Judge Sue L. Robinson. Signed by Judge Sue L. Robinson on Mar. 16, 2009. (nmf) (Entered: Mar. 16, 2009) (7 pgs).
Order Setting Teleconference: Telephone Conference set for Mar. 23, 2009 at 11:00 AM before Judge Mary Pat Thynge to discuss ADR. Signed by Judge Mary Pat Thynge on Mar. 16, 2009. (cak) (Entered: Mar. 16, 2009) (4 pgs).
Order Setting Teleconference: a teleconference has been scheduled for Monday, Jun. 1, 2009 at 10:00 a.m. with Magistrate Judge Thynge to discuss the status of the case and the parties negotiations. Counsel for MEMC shall initiate the teleconference call to 302-573-6173. It Is Further Ordered that the Court is holding Sep. 10, Sep. 14 and Sep. 15, 2009 as possible mediation dates. Counsel are to advise Judge Thynge by Mar. 30, 2009 if any of these dates works for everyone to schedule the mediation. Signed by Judge Mary Pat Thynge on Mar. 23, 2009. (cak) (Entered: Mar. 23, 2009) (2 pgs).
Order Setting Mediation Conferences: Mediation Conference Tentatively set for Sep. 15, 2009 at 10:00 AM in Courtroom 2B before Judge Mary Pat Thynge. See order for details. Signed by Judge Mary Pat Thynge on Mar. 24, 2009. (cak) (Entered: Mar. 24, 2009) (6 pgs).
Motion to Dismiss Based upon Fed. R. Civ. P. 12(b)(1) and (6) and Article III of the United States Constitution—filed by SOITEC Silicon On Insulator Technologies SA, Commissariat a LEnergie Atomique. (Attachments: # 1 Text of Proposed Order, # 2 Certificate of Service)(Kraft, Denise) (Entered: Apr. 7, 2009) (5 pgs).
Opening Brief in Support re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution filed by SOITEC Silicon On Insulator Technologies SA, Commissariat a LEnergie Atomique.Answering Brief/Response due date per Local Rules is Apr. 27, 2009. (Attachments: # 1 Certificate of Service)(Kraft, Denise) (Entered: Apr. 7, 2009) (13 pgs).

Answer to 19 Answer to Complaint, Counterclaim Partial Answer to Defendant's Counterclaims, Affirmative Defenses and Soitec Counterclaims, Counterclaim against MEMC Electronic Materials Inc. by SOITEC Silicon On Insulator Technologies SA, Commissariat a LEnergie Atomique. (Attachments: # 1 Certificate of Service)(Kraft, Denise) (Entered: Apr. 7, 2009) (18 pgs).

Notice of Service of First Request for Production of Documents and Things Directed to Commissariat A L'Energie Atomique; First Request for Production of Documents and Things Directed to SOITEC Silicon on Insulator Technologies, S.A. and Soitec USA, Inc.; and First Set of Interrogatories Directed to Soitec Silicon on Insulator Technologies, S.A., Soitec USA, Inc. and Commissariat A L'Energie Atomique by MEMC Electronic Materials Inc.. (Rogowski, Patricia) (Entered: Apr. 14, 2009) (3 pgs).

Stipulation to Extend Time Defendant to File Answering Brief in Opposition to Plaintiffs' Partial Motion to Dismiss Counterclaim Counts II, III, IV, V, and VIII to May 6, 2009—filed by MEMC Electronic Materials Inc.. (Rogowski, Patricia) (Entered: Apr. 21, 2009) (3 pgs).

Answer to 32 Answer to Counterclaim,,, of S.O.I. TEC Silicon on Insulator Technologies, S.A. and SOITEC U.S.A., Inc. by MEMC Electronic Materials Inc..(Rogowski, Patricia) (Entered: Apr. 23, 2009) (4 pgs).

Stipulation to Extend Time Answering Brief in Opposition to Plaintiffs' Partial Motion to Dismiss Counterclaim Counts II, III, IV, V and VIII to May 15, 2009—filed by MEMC Electronic Materials Inc.. (Rogowski, Patricia) (Entered: May 6, 2009) (3 pgs).

Notice of Service of Soitec's First Set of Interrogatories (Nos. 1-17) and Soitec's First Set of Requests for Production of Documents and Things (Nos. 1-132) by SOITEC Silicon On Insulator Technologies SA, Commissariat a LEnergie Atomique. (Attachments: # 1 Certificate of Service)(Kraft, Denise) (Entered: May 6, 2009) (2 pgs).

Stipulation to Extend Time for Defendant to File an Answering Brief in Opposition to Plaintiffs' Partial Motion to Dismiss Counterclaim Counts II, III, IV, V, and VIII; and Stipulation to Extend Time for Plaintiffs to File Responses to MEMC's First Requests for Production of Documents and to MEMC's First Set of Interrogatories to May 29, 2009—filed by SOITEC Silicon On Insulator Technologies SA, Commissariat a LEnergie Atomique. (Attachments: # 1 Certificate of Service)(Kraft, Denise) (Entered: May 13, 2009).

Notice of Service of (1) Subpoena to Hayes Soloway, P.C., (2) Subpoena to Pearne & Gordon, LLP, (3) Subpoena to Brinks Hofer Gilson & Lione, and (4) Subpoena to Winston & Strawn by MEMC Electronic Materials Inc. (Rogowski, Patricia) (Entered: May 14, 2009) So Ordered—re 38 Stipulation to Extend Time.Set Briefing Schedule: re 30 Motion to Dismiss. (Answering Brief due May 29, 2009.) (Refer to Stipulation for Further Details.). Signed by Judge Sue L. Robinson on May 15, 2009. (lid) (Entered: May 15, 2009).

Stipulation to Extend Time for Defendant to File Its Answering Brief until Jun. 5, 2009 by MEMC Electronic Materials Inc.. (Rogowski, Patricia) (Entered: May 28, 2009) So Ordered, re 40 Stipulation, Set Briefing Schedule: re 30 Motion to Dismiss Based upon Fed. R. Civ. P. 12(b)(1) and (6) and Article III of the United States Constitution. (Answering Brief due Jun. 5, 2009.). Signed by Judge Sue L. Robinson on May 29, 2009. (nmf) (Entered: May 29, 2009).

Notice of Service of (1) Soitecs Objections and Responses to MEMC's First Set of Interrogatories; (2) Soitecs Objections and Responses to MEMC's First Request For Production of Documents and Things; (3) CEAs Objections and Responses to MEMC's First Set of Interrogatories; and (4) CEAs Objections and Responses to MEMC's First Request For Production of Documents and Things by SOITEC Silicon On Insulator Technologies SA, Commissariat a LEnergie Atomique. (Attachments: # 1 Certificate of Service) (Kraft, Denise) (Entered: May 29, 2009).

Stipulation to extend date to Jun. 19, 2009 by which defendant may file an answering brief in opposion to plaintiffs' Partial Motion to Dismiss Counterclaim Counts II, III, IV, V, and VIII by MEMC Electronic Materials Inc.. (Rogowski, Patricia) (Entered: Jun. 5, 2009).

Notice of Service of MEMC's Answers to SOITEC's First Set of Interrogatories (Nos. 1-17) and MEMC's Responses to SOITEC's First Set of Requests for Production of Documents and Things (Nos. 1-132) by MEMC Electronic Materials Inc..(Rogowski, Patricia) (Entered: Jun. 5, 2009) So Ordered—re 42 Stipulation to Extend Time. Set Briefing Schedule: re 30 Motion to Dismiss. (Answering Brief due Jun. 19, 2009.). Signed by Judge Sue L. Robinson on Jun. 8, 2009. (lid) (Entered: Jun. 8, 2009).

Notice of Service of Soitec's Second Set of Requests For Production of Documents and Things (Nos. 133-135) re 41 Notice of Service,, by SOITEC Silicon On Insulator Technologies SA, Commissariat a LEnergie Atomique. Related document: 41 Notice of Service filed by SOITEC Silicon On Insulator Technologies SA, Commissariat a LEnergie Atomique. (Attachments: # 1 Certificate of Service)(Kraft, Denise) (Entered: Jun. 11, 2009).

Letter to Honorable Sue L. Robinson from Patricia Smink Rogowski regarding Transmitting Form of Protective Order. (Attachments: # 1 Form of Protective Order, # 2 Exhibit Exhibit A to Form of Protective Order)(Rogowski, Patricia) (Entered: Jun. 16, 2009).

Notice of Service of MEMC's Second Request for Production of Documents and Things Directed to S.O.I.TEC Silicon on Insulator Technologies, S.A. and Soitec USA, Inc. by MEMC Electronic Materials Inc..(Rogowski, Patricia) (Entered: Jun. 16, 2009) Set/Reset Hearings: Discovery Conference re-set per joint request of counsel for Sep. 16, 2009 08:30 AM in Courtroom 6B before Judge Sue L. Robinson. (nmf) (Entered: Jun. 18, 2009).

Stipulation to Extend Time Defendant's Answering Brief in Opposition to Plaintiffs' Partial Motion to Dismiss Counterclaim Counts II, III, IV, V, and VIII to Jul. 2, 2009—filed by MEMC Electronic Materials Inc.. (Rogowski, Patricia) (Entered: Jun. 19, 2009) So Ordered- re 47 Stipulation to Extend Time. Set Briefing Schedule: re 30 Motion to Dismiss (Answering Brief due Jul. 2, 2009.). Signed by Judge Sue L. Robinson on Jun. 23, 2009. (lid) (Entered: Jun. 23, 2009) So Ordered, re 45 Protective Order. Signed by Judge Sue L. Robinson on Jun. 30, 2009. (nmf) (Entered: Jun. 30, 2009).

Notice of by SOITEC Silicon On Insulator Technologies SA, Commissariat a LEnergie Atomique re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution *Notice of Withdrawal of Plaintiffs' Partial Motion to Dismiss Counterclaim Counts II, III, IV, V, and VIII* (Attachments: # 1 Certificate of Service)(Kraft, Denise) (Entered: Jul. 02, 2009).

Notice of Service of MEMC's Responses to SOITEC's Second Set of Requests for Production of Documents and Things Directed to MEMC by MEMC Electronic Materials Inc..(Rogowski, Patricia) (Entered: Jul. 14, 2009).

Stipulation and [Proposed] Order to File an Amended Complaint by SOITEC Silicon On Insulator Technologies SA, Commissariat a LEnergie Atomique. (Attachments: # 1 Exhibit A, # 2 Certificate of Service)(Kraft, Denise) (Entered: Jul. 16, 2009).

Notice of Service of Soitec's Objections and Responses to MEMC's Second Request For Production of Documents and Things Directed To Soitec re 46 Notice of Service by SOITEC Silicon on Insulator Technologies SA, Commissariat a LEnergie Atomique. Related document: 46 Notice of Service filed by MEMC Electronic Materials Inc.. (Attachments: # 1 Certificate of Service)(Kraft, Denise) (Entered: Jul. 16, 2009).

Notice of Withdrawal of Docket Entry 51 by SOITEC Silicon On Insulator Technologies SA, Commissariat a LEnergie Atomique re 51 Notice of Service, (Attachments: # 1 Certificate of Service)(Kraft, Denise) (Entered: Jul. 17, 2009).

Notice of Service of SOITEC's Objections and Responses to MEMC's Second Request for Production of Documents and Things Directed to SOITEC re 46 Notice of Service by SOITEC Silicon On Insulator Technologies SA, Commissariat a LEnergie Atomique. Related document: 46 Notice of Service filed by MEMC Electronic Materials Inc.. (Attachments: # 1 Certificate of Service)(Kraft, Denise) (Entered: Jul. 17, 2009).

Notice of Service of MEMC Electronic Materials, Inc.'s Second Set of Interrogatories Directed to S.O.I.TEC Silicon on Insulator Technologies, S.A., SOITEC USA, Inc. and Commissariat A L'Energie Atomique by MEMC Electronic Materials Inc..(Rogowski, Patricia) (Entered: Jul. 17, 2009).

Notice of Service of Soitec's Production of Documents Bates Numbered SCEA 00000001 to SCEA 00002442 by SOITEC Silicon on Insulator Technologies SA, Commissariat a LEnergie Atomique. (Attachments: # 1 Certificate of Service)(Kraft, Denise) (Entered: Jul. 17, 2009) So Ordered, re 50 Stipulation. Signed by Judge Sue L. Robinson on Jul. 20, 2009. (nmf) (Entered: Jul. 20, 2009).

Notice of Service of MEMC's Production of Documents Bates Numbered MEMC0300000 to MEMC0306530 by MEMC Electronic Materials Inc..(Rogowski, Patricia) (Entered: Jul. 20, 2009).

First Amended Complaint *for Patent Infringement* against MEMC Electronic Materials Inc.—filed by SOITEC Silicon On Insulator Technologies SA, Commissariat a LEnergie Atomique. (Attachments: # 1 Exhibit Exhibit 1, # 2 Exhibit Exhibit 2, # 3 Exhibit Exhibit 3, # 4 Exhibit Exhibit 4, # 5 Certificate of Service)(Kraft, Denise) (Entered: Jul. 21, 2009).

Notice of Service of Soitec S.A.'s Second Set of Interrogatories (Nos. 18-22) and CEA's First Set of Interrogatories (Nos. 1-11) by SOITEC Silicon On Insulator Technologies SA, Commissariat a LEnergie Atomique. (Attachments: # 1 Certificate of Service)(Kraft, Denise) (Entered: Jul. 23, 2009).

Notice of Service of S.O.I.TEC Silicon on Insulator Technologies, S.A. and Commissariat a Lenergie Atomique Supplemental Production of Documents Bates Numbered Slit 00000001 to Slit 00049728 re 43 Notice of Service, by SOITEC Silicon On Insulator Technologies SA, Commissariat a LEnergie Atomique. Related document: 43 Notice of Service, filed by MEMC Electronic Materials Inc.. (Attachments: # 1 Certificate of Service)(Kraft, Denise) (Entered: Jul. 27, 2009).

Answer to Amended Complaint Answer to 57 Amended Complaint, with Under Federal Rule of Civil Procedure 38, MEMC demands a trial by jury on all issues so triable., Counterclaim against all plaintiffs by MEMC Electronic Materials Inc.. (Attachments: # 1 Exhibit A, # 2 Certificate of Service)(Rogowski, Patricia) (Entered: Aug. 03, 2009).

Notice of Service of MEMC's Production of Documents Bates Numbered MEMC0300000—MEMC0337055 by MEMC Electronic Materials Inc..(Rogowski, Patricia) (Entered: Aug. 5, 2009).

Notice of Service of S.O.I.TEC Silicon on Insulator Technologies, S.A. and Commissariat a L Energie Atomique's Revised Supplemental Production of Documents Bates Numbered SLIT00000001—SLIT0004886; SLIT00004931 SLIT00004985; SLIT00005169 SLIT00005174; SLIT00005241 SLIT00006368; and SLIT00006886—SLIT00049728 re 59 Notice of Service, by SOITEC U.S.A., Inc., SOITEC Silicon On Insulator Technologies SA, Commissariat a LEnergie Atomique. Related document: 59 Notice of Service, filed by SOITEC Silicon On Insulator Technologies SA, Commissariat a LEnergie Atomique. (Attachments: # 1 Certificate of Service)(Kraft, Denise) (Entered: Aug. 6, 2009).

Stipulation to Extend Time to Answer or Otherwise Respond to MEMC's Amended Counterclaims to Aug. 31, 2009—filed by SOITEC Silicon On Insulator Technologies SA, SOITEC U.S.A., Inc., Commissariat a LEnergie Atomique. (Attachments: # 1 Certificate of Service)(Kraft, Denise) (Entered: Aug. 25, 2009).

Notice of Service of S.O.I.TEC Silicon on Insulator Technologies, S.A. and Commissariat a L Energie Atomique's Supplemental Production of Documents Bates Numbered SOIT 00000001 to SOIT 00003528 and SLIT 00049729 to SLIT 00060612 by SOITEC Silicon On Insulator Technologies SA, SOITEC U.S.A., Inc., Commissariat a LEnergie Atomique. (Attachments: #1 Certificate of Service)(Kraft, Denise) (Entered: Aug. 25, 2009).

Notice of Service of MEMC's Production of Documents Bates Numbered MEMC0337056 to MEMC0337503 and MEMC0337504-MEMC0338047 by MEMC Electronic Materials Inc..(Rogowski, Patricia) (Entered: Aug. 26, 2009).

Notice of Service of (1) SOITECs Supplemental Responses to MEMC Electronic Materials, Inc.s First Set of Interrogatories; and (2) CEAs Supplemental Responses to MEMC Electronic Materials, Inc.s First Set of Interrogatories re 41 Notice of Service by SOITEC Silicon On Insulator Technologies SA, SOITEC U.S.A., Inc., Commissariat a LEnergie Atomique. Related document: 41 Notice of Service filed by SOITEC Silicon On Insulator Technologies SA, Commissariat a LEnergie Atomique. (Attachments: #1. Certificate of Service)(Kraft, Denise) (Entered: Aug. 26, 2009).

Notice of Service of MEMC's Supplemental Answers to SOITEC's First Set of Interrogatories by MEMC Electronic Materials Inc.. (Rogowski, Patricia) (Entered: Aug. 27, 2009) So Ordered- re 63 Stipulation to Extend Time. Set/Reset Answer Deadlines: SOITEC Silicon On Insulator Technologies SA answer due Aug. 31, 2009; Commissariat a LEnergie Atomique answer due Aug. 31, 2009; SOITEC U.S.A., Inc. answer due Aug. 31, 2009. Signed by Judge Sue L. Robinson on Aug. 27, 2009. (lid) (Entered: Aug. 27, 2009).

Answer to 60 Answer to Amended Complaint, Counterclaim,,, Counterclaim *Reply to Defendant's Amended Counterclaims, Counterclaims And Affirmative Defenses* against MEMC Electronic Materials Inc. by SOITEC Silicon On Insulator Technologies SA, Commissariat a LEnergie Atomique, SOITEC U.S.A., Inc.. (Attachments: # 1 Certificate of Service)(Kraft, Denise) (Entered: Aug. 31, 2009).

Notice of Service of MEMC's Third Set of Interrogatories Directed to S.O.I.TEC Silicon on Insulator Technologies, S.A., SOITEC USA, Inc., and Commissariat a L'Energie Atomique by MEMC Electronic Materials Inc..(Rogowski, Patricia) (Entered: Sep. 1, 2009).

Agarwal et al., *Efficient Production of silicon-on-Insulator Films by Co-Implantation of He+ with H+*, 1998 American Institute of Physics, vol. 72, No. 9, Mar. 2, 1998, pp. 1086-1088.

Bruel et al., [vol. 99-1] Meeting Abstract No. 333, "Single-crystal semiconductor layer delamination and transfer through hydrogen implantation," *The 195th Metting of the Electrochemical Society*, May 2-6, 1999, Seattle, Washington.

Camperi-Ginestet et al., "Alignable Epitaxial Liftoff of GaAs Materials with Selective Deposition Using Polyimide Diaphragms", *IEEE Transactions Photonics Technology Letters*, vol. 3, No. 12, Dec. 1991, pp. 1123-1126.

Cerofolini et al. "Ultradense Gas Bubbles in Hydrogen-or-Helium-Implanted (or Co-implanted) Silicon", *Materials Science and Engineering*, B71, 2000, pp. 196-202.

Demeester, et al., "Epitaxial Lift-off and its Applications", *Semicond. Sci. Technol.*, vol. 8, 1993, pp. 1124-1135.

DiCioccio et al., "III-V layer transfer onto silicon and applications", *Phys. Stat. Sol.* (a), vol. 202, No. 4., 2005, pp. 509-515/DOI 10.1002/pssa. 200460411.

Feijoo et al., "Prestressing of Bonded Wafers", vol. 92-7 1992 pp. 230-238.

Feng et al., "Generalized Formula for Curvature Radius and Layer Stresses Caused by Thermal Strain in Semiconductor Multilayer Structures", *J. Appl. Phys.*, vol. 54, No. 1, 1983, pp. 83-85.

Hamaguchi, et al., "Novel LSI/SOI Wafer Fabrication Using Device Layer Transfer Technique" *Proc. IEDM*, 1985, pp. 688-691.

Henttinen et al. "Mechanically induced Si Layer Transfer in Hydrogen-Implanted Si-Wafers", *American Institute of Physics*, vol. 76, No. 17, Apr. 2000, pp. 2370-2372.

Kucheyev et al., "Ion implantation into GaN", *Materials Science and Engineering*, 33, 2001, pp. 51-107.

Liu et al., "Ion implantation in GaN at liquid-nitrogen temperature: Structural characteristics and amorphization," *Physical Review B of The American Physical Society*, vol. 57, No. 4, 1988, pp. 2530-2535.

Moriceau et al., [vol. 99-1] Meeting Abstract No. 405, "A New Characterization Process Used to Qualify SOI Films," *The 195th Meeting of the Electrochemical Society*, May 2-6, 1999, Seattle, Washington.

Pollentier et al., "Fabrication of High-Radiance LEDs by Epitaxial Lift-off" *SPIE*, vol. 1361, 1990, pp. 1056-1062.

Suzuki et al., "High-Speed and Low Power $n^+$-$p^+$Double-Gate SOI CMOS", *IEICE Trans. Electron.*, vol. E78-C, No. 4, Apr. 1995, pp. 360-367.

Timoshenko, S., "Analysis of Bi-Metal Thermostats", *J.Opt.Soc. Am.*, 11, 1925, pp. 233-256.

Tong et al, "Low Temperature SI Layer Splitting", *Proceedings 1997 IEEE International SOI Conference*, Oct. 1997, pp. 126-127.

Wong et al., "Integration of GaN Thin Films with Dissimilar Substrate Materials by Pd-In Metal Bonding and Laser Lift-off", *Journal of Electronic Materials*, vol. 28, No. 12, 1999, pp. 1409-1413.

Yun et al., "Fractional Implantation Area Effects on Patterned Ion-Cut Silicon Layer Transfer," Dept. of Electrical Eng. And Computer Sciences, University of California, Berkeley, CA 94720, USA, 1999 IEEE International SOI Conference, Oct. 1999, p. 129-30.

Yun et al., "Thermal and Mechanical Separations of Silicon Layers from Hydrogen Pattern-Implanted Wafers," Journal of Electronic Materials, vol. No. 36, No. 8 2001.

* cited by examiner

METHOD OF DETACHING A THIN FILM BY MELTING PRECIPITATES

PRIORITY CLAIM

This application is a U.S. nationalization of PCT Application No. PCT/FR2007/000534, filed Mar. 28, 2007, and claims priority to French Patent Application No. 0651088, filed Mar. 29, 2006.

JOINT RESEARCH AGREEMENT

The claimed invention was made by, on behalf of, or in connection with one or more of the following parties to a joint development agreement: Commissariat a L'Energie Atomigue and Soitec S.A. The agreement was in effect on and before the date of the invention claimed herein, and the claimed invention was made as a result of activities undertaken within the scope of the agreement.

TECHNICAL FIELD

The invention concerns a method of detaching a thin film from a substrate by melting precipitates.

BACKGROUND

There is known already, from U.S. Pat. No. 5,374,564 to Bruel, a method of fabricating thin films of semiconductor materials comprising the following steps:
1. bombarding a face of a substrate with ions, in order to implant those ions in sufficient concentration to create a layer of gaseous microbubbles forming microcavities defining a weakening layer;
2. bringing this face of the substrate into intimate contact with a stiffener; and
3. separation at the level of the layer of microcavities, by the application of heat treatment.

In the above document, the ions implanted in step 1 are advantageously hydrogen ions, but it is indicated that rare gases can also be used. As for the substrate, in the examples considered, it is formed of silicon, but it is indicated that it can also consist of semiconductors from group IV of the periodic table of the elements, such as germanium, silicon carbide or silicon-germanium alloys.

In the above document, separation is achieved by means of heat treatment, but it is then proposed, in variants of the method, to bring about the separation by applying, in association or not with such heat treatment, a detachment stress (for example, inserting a blade between the two substrates and/or applying traction forces and/or bending forces and/or shear forces, and/or applying ultrasound or microwaves of carefully chosen power and frequency). See in particular—U.S. Pat. No. 6,020,252 to Aspar et al. and improvements thereto.

The above technique has been tested on substrates formed of other materials, with implantation of other ions, light or otherwise.

The defects created in this way have been given various names: not only gaseous microcavities, but also flatter defects (sometimes referred to as microplatelets).

Generally speaking, this technology uses gaseous microcavities localized in the substrate, at a depth at which it is required to "cut off" a thin layer.

However, the principle of bombarding a substrate with ions is also known for other purposes. Thus it is known to use such bombardment, in the same field of semiconductors and microelectronics, to carry out doping, with efficacies in direct proportion to the implantation doses.

In this regard, various studies have been carried out with a view to characterizing accurately the consequences of such doping, i.e. to characterizing the crystal defects or inclusions that can result from such doping, and, where possible, to determining how to avoid or at least minimize such deterioration.

In particular, S. K. JONES et al., in the paper "Enhanced elimination of implantation damage upon exceeding the solid solubility", Journal of Applied Physics, Vol. 62, No. 10, 15 Nov. 1987, pp. 4114-4117, discuss the implantation of ions of gallium or phosphorus, or even arsenic, in various substrates, including silicon, and come to the conclusion that, if the peak concentration of the doping impurity exceeds its solubility in silicon at the annealing temperature, there is improved elimination of defects of type II (consisting in particular of dislocation loops) when the precipitates, formed because of the excess implanted species, are dissolved. To be more precise, they found in particular that implanting gallium ions in silicon at 100 keV and at a dose of $10^{15}/cm^2$ leads to amorphization of the silicon, with a gallium concentration peak that is greater than the solubility of gallium in silicon both at 900° C. and at 1100° C. (the limit of solubility of gallium in silicon is hardly of the order of $2.10^{19}/cm^3$ at 900° C. or $5.10^{19}/cm^3$ at 1100° C.); however, 16 hours of annealing at 550° C. leads to recrystallization of the amorphous phase, and if this is followed by annealing at 900° C. for 1 hour, precipitates are formed which dissolve if the temperature or the duration is increased (for example to 8 hours at 900° C.), eliminating defects of type II.

J. MATSUO et al., in the paper "Abnormal solid solution and activation behavior in Ga-implanted Si (100)", Applied Physics Letters, Vol. 51, No. 24, 14 December 1987, pp. 2037-2039, discuss the effects of annealing on silicon doped with gallium, and come to the conclusion that the behavior on annealing substrates implanted with gallium is different from that observed with other dopants. To be more precise, they found that implanting gallium in silicon at 70 keV and $10^{15}/cm^2$, followed by annealing for 10 s at 600° C., led to amorphization of the silicon, that the gallium concentration peak ($2.10^{20}/cm^3$) at 70 keV is ten times greater than the solubility limit of gallium in silicon at 900° C., and that annealing at 1100° C. for 10 s cause the gallium to precipitate.

Studies carried out to investigate the phenomena of formation of precipitates of gallium include that of S. DHARA et al., "Mechanism of nanoblister formation in Ga+ self-ion implanted GaN nanowires", Applied Physics Letters, Vol. 86, No. 20, pp. 203199, 1 to 3 Sep. 2005; the authors found that implanting gallium in GaN nanowires at 50 keV and $2.10^{16}/cm^2$ led to the appearance of precipitates of gallium with a diameter from 50 nm to 100 nm, and that there was a deficit of N atoms and an accumulation of Ga around the region of voids.

Note that gallium can be used in the field of semiconductors and microelectronics for applications other than doping, in particular synthesizing certain materials.

Thus M. K. SUNKARA et al., in "Bulk synthesis of silicon nanowires using a low-temperature vapor-liquid-solid solution", Applied Physics Letters, Vol. 79, No. 10, September 2001, pp. 1546-1548, describe a low-temperature vapor-liquid-solid synthesis process that uses low-solubility solid metal solvents for silicon and other semiconductor materials. They propose in particular synthesizing silicon nanowires using gallium as solvent, building on a Ga—Si phase diagram that shows that there is a eutectic compound, $Ga_{(1-x)}Si_x$ with $x=5.10^{-8}\%$, which has a melting point of 29.8° C. (equal to that of pure gallium).

SUMMARY

An object of the invention is to exploit structural modifications found in various implantation techniques, other than voids or gaseous cavities, to enable detachment of thin films, without having to generate microbubbles or microcavities or microplatelets, and in particular enabling use, both for the substrate and for the implanted ions, of species that do not form gaseous molecules. It aims in particular to exploit formation of appropriate precipitates.

It is based on the fact that, by judiciously choosing, for a given substrate, the implanted species and the implantation conditions, and also the conditions of any subsequent heat treatment, some of the inclusions and precipitates formed as a consequence of implanting ions in the substrate have a melting point within the range of temperatures at which it is usual to apply a treatment such as annealing (typically between 50° C. and 1100° C.), so that detachment can be achieved when these inclusions or precipitates are in the liquid phase, and have a behavior in relation to the substrate that approximates that of microbubbles or microcavities.

Thus the invention proposes a method of fabricating a thin film from a substrate, including the following steps:

(1) implanting in the substrate ions of a non-gaseous species, that species and the implantation conditions being chosen as a function of the material of the substrate so as to enable the formation of precipitates confined in depth, distributed within a layer, those precipitates being in a solid phase having a melting point below that of the substrate; and (2) detaching a thin film by breaking the substrate at the level of the layer of precipitates by applying a detachment stress under conditions in which the precipitates are in the liquid phase.

In this method, and in contrast to the method described in the document U.S. Pat. No. 5,374,564, the ions implanted in step 1 are therefore not gaseous species: the implanted ions are of any non-gaseous ion type, adapted to form in the substrate, after implantation, alone or conjointly with the species (or a species) contained in the substrate, precipitates having a melting point within the range of temperatures in which it is usual to apply treatments to the substrates, thin films or components used in microelectronics.

Note that, in the aforementioned documents by JONES et al. and MATSUO et al., the presence of gallium precipitates is required only to dissolve them and thereby eliminate defects resulting from implantation. There is no disclosure therein that these precipitates have a low melting point or, a fortiori, that this can be exploited to bring about detachment at a temperature at which these precipitates are liquid.

Similarly, in the aforementioned paper by DHARA et al., who detected the formation of gallium precipitates after implanting gallium in GaN, there is no suggestion of obtaining any benefit from those precipitates; note that the document indicates as a problem the fact that gallium melts at 302.8 K, with the result that the document cannot be considered as containing even the slightest recognition that the precipitates can be exploited to bring about detachment under conditions in which they are no longer solid.

With regard to the document by SUNKARA et al., it has been stated that it proposes to exploit a Ga—Si eutectic in the liquid state, but is concerned only with synthesizing silicon, independently of any idea of implantation with a view to detachment.

The various advantageous features of the aforementioned method, where appropriate combined, include:

implantation of the ions, in practice by bombardment, is preferably effected at a temperature below the melting point of the precipitates, which in particular enables the precipitates to begin to form in the solid phase, the melting point of the precipitates is advantageously above room temperature, which guarantees that, at room temperature, the precipitates are in the solid phase, which minimizes the risk of unintentional separation, implantation, in theory by bombardment, can be effected substantially at room temperature, which corresponds to conditions that are particularly beneficial from the energy point of view, detachment can be effected after increasing the temperature of the substrate above the melting point of the precipitates, which implies that the precipitates are normally in the solid phase and go to the liquid phase only when that is required; this detachment is effected at a temperature at least 15° C. above the melting point of the precipitates, for example, which contributes to ensuring that all the precipitates are in the liquid phase, regardless of their locations and their sizes, detachment can be preceded by a plurality of cycles that vary the temperature of the substrate containing the precipitates on either side of the melting point thereof, which contributes to increasing local weakening of the layer in which the precipitates are confined, for example because of the change of volume associated with the successive changes of phase; the plurality of cycles includes around ten cycles, for example, or more, which implies very significant weakening; if the melting point is above room temperature, this plurality of cycles can consist in varying the temperature of the substrate from room temperature between a temperature above the melting point, the melting point of the precipitates can be chosen above room temperature and below 200° C., which is generally considered a low temperature; to this end, the ions are advantageously chosen within the group comprising cesium, gallium, rubidium, potassium, sodium, indium and lithium (although this list in no way claims to be comprehensive, as many other precipitates can be obtained by implantation that have a melting point in the range concerned); if a melting point of the precipitates is required above room temperature but below 100° C., which is beneficial from the energy point of view, the ions are advantageously chosen within the subgroup comprising cesium, gallium, rubidium, potassium and sodium (although this list in no way claims to be comprehensive, as other precipitates can be obtained by implantation having a melting point in the range concerned); a precipitate melting point above room temperature but below 50° C. can even be chosen, which implies only very moderate variations of temperature, in which case the ions are advantageously chosen within the subgroup comprising cesium and gallium (although this list in no way claims to be comprehensive, as other precipitates can be obtained having a melting point in the range concerned), the ions are advantageously gallium ions, which corresponds to a practical instance of particular benefit, all the more so in that its melting point is particularly low, the substrate can consist of a solid part, such as a wafer; alternatively, the substrate can be merely a layer carried by a support, for example referred to as the support substrate, within a part (such as a wafer) formed of a plurality of stacked layers, in practice of different materials (in this case, in the context of the invention, the substrate referred to is the layer in which the precipitates are formed; this layer called the substrate is usually, although not necessarily, the uppermost layer of this multilayer part, possibly covered with a much thinner layer, for example of oxide), the substrate (and therefore at least the portion of the aforementioned part in which precipitates are formed) is advantageously of a crystalline (monocrystalline, or even polycrystalline) material, the substrate (and therefore at least the portion of the aforementioned part in which precipitates are formed) is advantageously of a semiconductor material, the substrate is advantageously of silicon, which is also of great practical importance; however the substrate can also be chosen more generally from one or more materials from group IV of the periodic table of the elements, if the ions are gallium ions implanted in silicon, they are advantageously implanted in the silicon substrate at an energy of at least approximately 100 keV and a dose of at least $10^{15}/cm^2$, alternatively, the substrate can be of gallium nitride, which is also of great practical importance; more generally, the substrate can also be chosen from materials in groups III-V of the periodic table of the elements, especially AsGa and InP, or a material from group III-N (for example GaN, InN, AIN); in a further variant, the substrate can also be chosen from materials from group II-VI such as ZnO or ZnSe, for example, if the ions are gallium ions implanted in a gallium nitride substrate, they are advantageously implanted at an energy of at least approximately 50 keV and a dose of at least $10^{15}/cm^2$, the precipitates can essentially consist of the species implanted in the substrate, which contributes to minimizing deterioration of the substrate outside the layer; alternatively, if they are not formed only of implanted ions, these precipitates contain, in addition to the implanted species, a species contained in the substrate; this applies in particular to the eutectic that can be observed between gallium and silicon, the face of the substrate through which the ions are implanted is advantageously brought into intimate contact with a stiffener; however, a stiffener may be of no benefit, especially if the thin layer finally obtained is sufficiently rigid to be self-supporting, the face of the substrate can be brought into intimate contact with the stiffener at a temperature below the melting point of the precipitates, for example, which in particular avoids them coming into intimate contact when the precipitates are in the liquid phase, this bringing into intimate contact is effected at room temperature, which is also particularly beneficial from the energy point of view, the bringing of the substrate into intimate contact with the stiffener is effected by molecular adhesion, which is a well-known and proven technique for bringing materials into intimate contact; heat treatment is advantageously applied to reinforce the bonding, i.e. the interface between the substrate and the stiffener;

this bringing into intimate contact can also be effected by depositing a layer sufficiently thick to form said stiffener, that layer is advantageously deposited epitaxially from the substrate, typically to a depth of several hundred microns (this epitaxially grown layer and the substrate are therefore advantageously produced in materials that are identical or at least compatible from the crystal lattice point of view); in this case, the substrate is preferably carried by a support substrate having a coefficient of thermal expansion significantly different from that of the epitaxially grown layer, in which case a variation of temperature, for example lowering the temperature after epitaxial deposition, causes stresses in the precipitates, which encourages rupture at the level of those precipitates, the detachment stress is mechanical, for example, enabling good control of its amplitude; it can also be chemical (it can exploit the stresses generated by the presence of the precipitates; selective chemical attack can preferentially attack the stressed areas of the substrate), this detachment stress is advantageously substantially localized in the layer of precipitates in the liquid phase, which avoids stressing the rest of the substrate, the localized detachment stress can be produced by inserting a blade between the substrate and the stiffener, which is a technique well known in itself, this detachment stress can be applied in the form of traction forces applied to the substrate and to the stiffener; these forces can instead be bending forces and/or shear forces, which are also techniques well known in themselves; this stress can also be applied by means of ultrasound or microwaves of appropriate power and frequency, the stiffener can be produced in the same material as the substrate; however, the stiffener can also be in a material having a coefficient of expansion significantly different from that of the substrate, given the low temperatures that the process employs, this method advantageously further includes a finishing treatment applied to the face of the thin film exposed by the detachment, this method advantageously further includes steps, known in themselves, between implantation and detachment, of fabricating all or part of microelectronic components, this method can further include heat treatment, for example annealing, adapted to encourage the appearance of precipitates following implantation (preferably before bringing into intimate contact with a stiffener, if any, to minimize the mass to be heated to a high temperature; however, this heat treatment can also take place after such bringing into intimate contact, in which case the precipitates are formed in a number of steps).

BRIEF DESCRIPTION OF THE DRAWING

Objects, features and advantages of the invention emerge from the following description given by way of illustrative and nonlimiting example and with reference to the appended drawing, in which.

DETAILED DESCRIPTION

Figure 1:
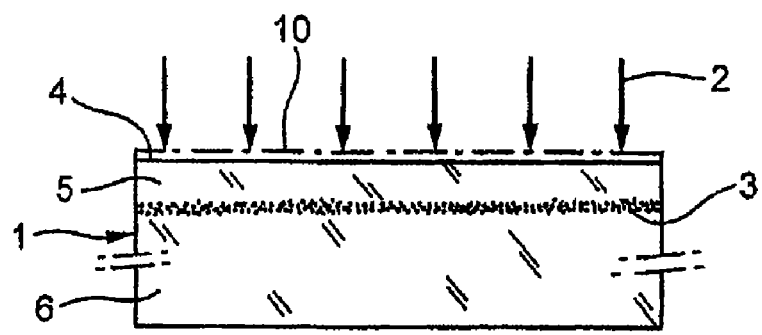
FIG. 1 is a diagram showing a substrate subjected to ionic bombardment and inside which a layer of inclusions or precipitates has been formed in accordance with an aspect of the invention.
Figure 2:
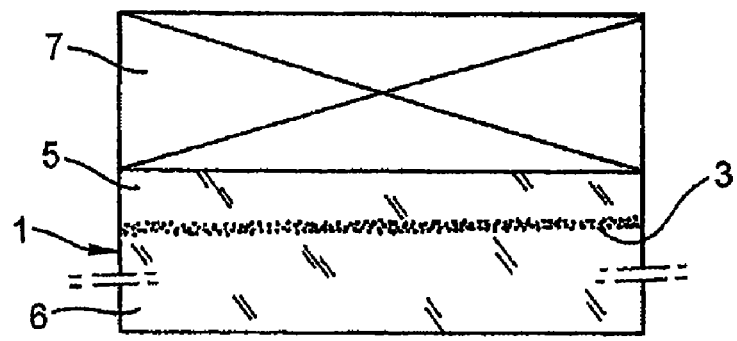
FIG. 2 is a diagram showing the implanted and weakened substrate after bonding a stiffener in accordance with an aspect of the invention.
Figure 3:
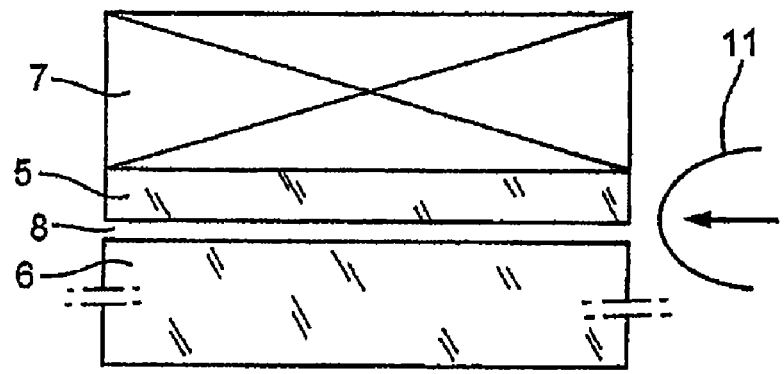
FIG. 3 is a diagram showing the assembly from FIG. 2 in accordance with an aspect of the invention after application of detachment stresses (in the form of mechanical stresses) at a temperature at which the precipitates are liquid.

FIGS. 1 to 3 represent the main steps of a method according to an embodiment of the invention.

FIG. 1 represents a substrate 1 (sometimes called a wafer), in theory produced in a semiconductor material such as silicon.

The latter substrate is subjected to ionic bombardment shown diagrammatically by the arrows 2. The non-gaseous nature (in particular, the species) of these ions is chosen as a function of the nature of the substrate (formed of one or more species of atoms) and the implantation conditions, in particular the bombardment conditions (primarily the dose, the energy and the temperature) are chosen to create precipitates that are confined in the depthwise direction, to enable the formation of a layer 3 of precipitates (or inclusions), those precipitates being formed of implanted atoms and where applicable of atoms of the substrate. These precipitates also have the particular feature of being in a first phase, namely a solid phase, and of having a melting point within (or even below) a range of temperatures considered as moderate temperatures in microelectronics, and therefore compatible with the substrate. This melting point is advantageously below 200° C., or even below 100° C., or even below 50° C.

The bombardment is effected via an upper face 4 of the substrate, where applicable covered with a layer 10, for example of oxide, obtained intentionally or not.

This bombardment causing the formation of precipitates can be accompanied by conjoint or posterior heat treatment to diffuse the implanted atoms to form the required precipitates.

The layer 3 of precipitates and the free surface 4 delimit the future thin film 5 to be obtained, while the rest of the substrate, under this layer 3, is designated by the reference number 6. This thin film typically has a thickness of the order of one micron, or even less than one micro, or even less than one tenth of a micron.

Of course, the dimensional proportions between the various layers of FIG. 2 are not shown to scale, to clarify the diagram.

In the example shown in FIG. 1, the substrate is solid, i.e. forms the whole of the self-supporting part (such as a wafer) that is used. As is described hereinafter, this substrate is alternatively only a layer (carried by a support) within a part formed of at least two layers (at least the layer forming the substrate and a layer forming the support) of materials that are in practice different, what is essential for implementing the invention being that the precipitates are formed in this layer forming the substrate; the substrate is preferably the topmost layer of this multilayer part (which does not rule out there being a very thin covering layer such as the layer 10 referred to above).

In FIG. 2, an optional support substrate 7, sometimes also referred to as a stiffener, is brought into intimate contact with the future thin film; here it is bonded, preferably by molecular adhesion, to the free surface 4 of the substrate through which the ionic bombardment took place. Alternatively, this stiffener can be produced by deposition on the future thin film by any technique known to the person skilled in the art (for example chemical vapor phase deposition, and the like). This stiffener can be produced in the same material as the starting substrate 1 (or with that material as an essential constituent: it can be an oxide of the species constituting the substrate, for example). It can also consist of a material having a coefficient of thermal expansion different from that of the substrate provided that that substrate/stiffener combination is compatible with later heat treatment. In fact a stiffener of this kind can be omitted if the thin film finally obtained is of sufficient thickness, in particular to be manipulated without damage.

In FIG. 3, at a temperature at which the precipitates forming the layer 3 are in the liquid phase (which can involve heat treatment at moderate temperature), detachment stress, here a stress concentration, is applied, preferably at the level of the layer of precipitates. This localized application of stress is here obtained by means of a blade the tip 11 of which, given the dimensions of the thin film (typically a few hundredths, or even tenths, of a micron), faces the interface between the substrates and also faces the layer of precipitates. Alternatively, the mechanical stresses are applied by applying traction and/or bending and/or shear forces, as is known in itself in relation to detaching thin films; this application of detachment stresses can also be the result of applying ultrasound or microwaves of judiciously chosen power and frequency. Alternatively, the detachment stress is produced by chemical attack, for example selective attack exploiting the stressed state of the area of the substrate in which the layer of precipitates is formed.

The passage of the precipitates from the solid phase to the liquid phase can be the result of simply applying mechanical and/or chemical stresses. Otherwise, the rise in temperature can be simultaneous with the application of these stresses, or precede them, with the aim of achieving an even distribution of temperature, ensuring that all the precipitates are in the same state.

The thin film is advantageously detached at a temperature different from the implantation temperature and the bonding temperature, so as to cause the precipitates to change phase (solid to liquid) at the time of detachment, and at that time only. Furthermore, being able to bring about successive changes of phase (solid, then liquid, then solid, then liquid, etc.) can increase the weakening of the layer 3 by the precipitates.

However, it is clear that, if the precipitates are liquid at the end of implantation or during bonding, that is not unacceptable, provided that excessive stress is not applied under these conditions (moderate implantation doses must then be used, to prevent detachment occurring at too low a stress, especially too low a mechanical stress).

Given that the layer of precipitates is weakened by the fact that the precipitates are in the liquid phase, this localized application of mechanical and/or chemical stress causes separation of the substrate/stiffener combination until they are completely detached, with the appearance of a space 8 between two parts, namely the remainder 6 of the starting substrate and the stiffener 7 to which the thin film 5 remains attached.

Finishing treatment can then be applied, in known manner, to confer on the surface of the thin film exposed by the separation an appropriate surface state for further use of the thin film.

This finishing treatment includes conventional mechanical polishing, for example, followed by high-temperature annealing treatment to heal any structural defects that may exist in the thin film.

Various examples of the choice of substrate and implanted ions, together with appropriate implantation conditions, are set out hereinafter.

Example 1

Initially, a substrate of silicon, for example monocrystalline silicon (although a polycrystalline substrate can also be used) is implanted with $Ga^+$ ions under the following conditions:

| | |
|---|---|
| * energy | 100 keV |
| * dose | $10^{15}$ cm$^{-2}$ |

This implantation is effected substantially at room temperature.

The depth of the gallium peak obtained in this way is 75 nm below the surface (this value has been validated by simulation using the SRIM (Stopping and Range of Ions in Matter) software.

The substrate is then bonded, by molecular adhesion, to a support substrate, produced in the same material as the initial substrate, for example, here silicon. This bringing into intimate contact is effected substantially at room temperature.

An annealing treatment at 1100° C. for 10 s is then applied to the assembly, which contributes to reinforcing the interface between the two substrates; precipitates of gallium or of $Ga_{(1-x)}Si_x$ type (see the aforementioned papers) are seen, localized to the depth of the gallium peak. These precipitates are liquid above a threshold of 30° C. and, under these conditions, weaken the implanted substrate.

Applying mechanical stresses at a temperature above this threshold (for example at 50° C.), in particular at a temperature at which the precipitates are liquid, for example by inserting a blade between the initial substrate and the substrate forming the stiffener, then leads to separation of the two substrates, not at the location of their molecular bonding interface, but at the level of the liquid precipitates within the initial substrate: there is obtained in this way a thin film of the first substrate transferred onto the stiffener (whence the term support substrate).

Detachment has also been obtained by chemical attack exploiting the fact that, at the location of the layer of precipitates, the silicon is stressed by the presence of those precipitates. The known SECCO chemical etching technique is employed for preferential etching of stressed silicon. Such etching in combination with the application of mechanical constraints, in practice additional to the prestressing caused by the precipitates, therefore facilitates detachment.

Finishing treatments of polishing type (conventional or chemical, annealing, in particular) are then applied to eliminate the residues of precipitates and to obtain a surface state of good quality.

The thin film can then be treated using techniques known for implanting gaseous ions.

There can be, between implantation and detachment, steps of forming on the free face 4 all or part of microelectronic components.

Example 2

A silicon substrate, for example with the same characteristics as the starting substrate of example 1, is implanted with Ga+ ions under the following conditions (substantially at room temperature):

| * energy | 100 keV |
| * dose | $10^{15}\,cm^{-2}$ |

As in example 1, this corresponds to a gallium peak at a depth of 75 nm in the substrate.

Annealing at 1100° C. for 10 s causes precipitates to appear, as in example 1, localized to a depth of 75 nm.

The substrate is then bonded, by molecular adhesion, to a support substrate (differing in this from example 1, where this bonding is effected before the annealing treatment). This bonding being effected at a temperature below 30° C., the precipitates remain solid.

As in example 1, the application of mechanical stresses at a temperature above 30° C. (for example at 50° C.) by inserting a blade between the two substrates causes the assembly to break at the level of the precipitates in the first substrate, which are in the liquid state.

There is therefore obtained, as in example 1, a thin film transferred onto a support substrate, and finishing treatments (polishing, annealing, and the like) eliminate residues of precipitates and produce a surface of good quality. As in example 1, this thin film can be subject to treatment enabling its use.

Example 3

A silicon substrate is implanted under the same conditions as in example 1 (or example 2), and then bonded to a support substrate and annealed for 10 s at 1100° C., as in example 1.

A series of temperature cycles (for example around ten such cycles) around the melting point of the precipitates, in particular around 30° C., with temperature variations between 20° C. (or room temperature) and 40° C., for example, is then applied: the precipitates therefore pass cyclically from a solid phase to a liquid phase and vice versa, changing volume (gallium is more dense in the liquid state than in the solid state), which locally increases the deterioration and therefore the weakening of the layer of the substrate in which the precipitates are concentrated.

Applying mechanical stresses above 30° C., as in the preceding examples, for example towards 50° C., then causes the assembly to break at the level of the liquid precipitates. However, the mechanical stresses necessary for this are lower than in examples 1 and 2 because of the supplementary deterioration induced by the series of temperature cycles; application of the same stresses as in the preceding examples therefore leads to rupture more quickly.

The same treatments are applied as before, from the finishing point of view and then from the point of view of use of the thin film obtained in this way.

Example 4

A substrate, produced in gallium nitride GaN (in the wurtzite phase, for example) is implanted with Ga+ ions under the following conditions (substantially at room temperature):

| * energy | 50 keV |
| * dose | $5.10^{16}\,cm^{-2}$ |

There are obtained in this way precipitates of solid gallium (see the aforementioned paper by DHARA et al.), localized at a depth of 24 nm below the implantation surface (including according to SRIM simulations).

Given that nitrogen is a gas, there are also microcavities filled with this gas.

In fact a higher dose can be used if a greater quantity of precipitates of the same kind and at substantially the same depth is required.

The GaN substrate is then bonded by molecular adhesion to a support substrate, for example a sapphire substrate, the temperature of the steps involved in bonding remaining below 30° C., so that the precipitates remain solid throughout the bonding operation.

Heat treatment including a step at more than 30° C. (for example at 50° C.) is then applied to the assembly, which leads to a change in the phase of the precipitates, which become liquid, and weaken the substrate at the level of the layer in which they are concentrated.

Applying mechanical stresses at a temperature above 30° C., by inserting a blade as in the preceding examples, causes separation of the two substrates at the level at which the liquid precipitates are concentrated.

A thin film of GaN is obtained in this way which can then be subject to all the appropriate finishing and use treatments.

Example 5

Starting from a part formed of a sapphire support substrate (alternatively, this material can be a material other than GaN) carrying a GaN layer a few microns thick; the substrate, in the sense of the foregoing description, is therefore formed here of this GaN layer. After forming precipitates in this layer by bombardment (assisted or not by heat treatment), for example using the data of the previous example, there follows epitaxial regrowth of GaN (typically effected at a temperature between 800° C. and 1100° C.) over several hundred microns. The precipitates are liquid at the epitaxy temperature. As the temperature falls, fracture can occur at the level of the area of precipitates (still in the liquid state) because of the difference in the coefficient of thermal expansion between the material of the support substrate (here sapphire) and that of the epitaxially grown material (inducing stresses at the level of the structure), where applicable in combination with application of an external mechanical stress. After this fracture, a solid GaN substrate is obtained formed of epitaxially grown material and the portion of the starting substrate situated above the area of precipitates.

This example shows the benefit that there can be in introducing species having high melting points.

Other pairs of materials can be used in accordance with the invention. Thus various examples of atoms that can be subjected to ionic implantation are indicated hereinabove (including gallium), with their melting point (depending on what is required, elements with a low melting point may be preferred (typically less than about 200° C.) or on the contrary elements having higher melting points may be preferred):

| | |
|---|---|
| mercury | −38.87° C. |
| cesium | 28.5° C. |
| gallium | 29.8° C. |
| rubidium | 38.89° C. |
| phosphorous | 44.2° C. (non metallic) |
| potassium | 63.25° C. |
| sodium | 97.8° C. |
| sulfur | 119° C. (non metallic) |
| indium | 156.6° C. |
| lithium | 180.5° C. |
| tin | 231.9° C. |
| thallium | 303.5° C. |
| zinc | 419.5° C. |
| tellurium | 450° C. |
| magnesium | 649° C. |
| aluminum | 660.4° C. |
| cerium | 799° C. |
| calcium | 839° C. |
| germanium | 937.4° C. (non metallic) |
| silver | 961.9° C. |

These atoms can in particular be implanted in bulk or non-bulk, crystalline or non-crystalline, semiconductor or non-semiconductor substrates, in silicon or in a silicon-based material (for example silicon oxide or even silicon carbide or silicon nitride), or even in other materials used in microelectronics (GaN—see above, GaAs, a-Si:H, diamond, sapphire, in particular, see germanium and its alloys with silicon), even in a material from group III-V, group III-N or group II-VI.

As is known in itself, various treatments can be applied, between the steps of the process described with reference to FIGS. 1 to 3, with a view to fabricating part or all of microelectronic components on the free surface of the substrate, before it is brought into intimate contact with the stiffener.

The invention claimed is:

1. A method of fabricating a thin film from a substrate, including the following steps:
   (1) implanting ions of a non-gaseous species in the substrate, wherein the species and implantation conditions are selected for the substrate material so as to enable the formation of precipitates confined in depth and distributed within a layer of the substrate, wherein the precipitates comprise a solid phase having a melting point below that of the substrate; and
   (2) detaching a thin film by breaking the substrate at the level of the layer of precipitates by applying a detachment stress under conditions in which the precipitates are in a liquid phase.

2. The method according to claim 1, wherein implanting ions comprises implantation at a temperature below the melting point of the precipitates.

3. The method according to claim 1, wherein a melting point of the precipitates is above room temperature.

4. The method according to claim 3, wherein implanting ions comprises implantation at substantially room temperature.

5. The method according to claim 1, wherein detaching the thin film is carried out after raising the temperature of the substrate above the melting point of the precipitates.

6. The method according to claim 1, wherein detaching the thin film is preceded by a plurality of cycles that vary the temperature of the substrate containing the precipitates on either side of the melting point thereof.

7. The method according to claim 1, wherein implanting ions comprises implanting ions of cesium, gallium, rubidium, potassium, sodium, indium or lithium.

8. The method according to claim 1, wherein implanting ions comprises implanting gallium ions.

9. The method according to claim 1, wherein the substrate comprises a layer overlying a support substrate.

10. The method according to claim 1, wherein the substrate comprises a crystalline material.

11. The method according to claim 1, wherein the substrate is a semiconductor material.

12. The method according to claim 1, wherein the substrate is in silicon.

13. The method according to claim 8, wherein the gallium ions are implanted in a silicon substrate at an energy of at least 100 keV and a dose of at least $10^{15}/cm^2$.

14. The method according to claim 1, wherein the substrate comprises gallium nitride.

15. The method according to claim 1, wherein the substrate comprises a material from group III-V.

16. The method according to claim 1, wherein the substrate comprises a material from group III-N.

17. The method according to claim 1, wherein the substrate comprises a material from group II-VI.

18. The method according to claim 8, wherein the substrate comprises gallium nitride and the gallium ions are implanted in the gallium nitride substrate at an energy of at least approximately 50 keV and a dose of at least $10^{15}/cm^2$.

19. The method according to claim 1, wherein the precipitates consist essentially of the species implanted in the substrate.

20. The method according to claim 1 further comprising bringing a face of the substrate through which the ions are implanted into intimate contact with a stiffener.

21. The method according to claim 20, wherein bringing the face of the substrate into intimate contact with the stiffener comprises a process carried out at a temperature below the melting point of the precipitate.

22. The method according to claim 20, wherein bringing the face of the substrate into intimate contact with the stiffener comprises a process carried out at room temperature.

23. The method according to claim 20, wherein bringing the substrate into intimate contact with the stiffener comprises a molecular adhesion process.

24. The method according to claim 23 further comprising applying a heat treatment to strengthen the interface between the substrate and the stiffener.

25. The method according to claim 20, wherein the stiffener comprises a deposited layer sufficiently thick to form the stiffener, and wherein bringing the substrate into intimate contact comprises contacting the deposited layer.

26. The method according to claim 25, wherein the deposited layer is formed by a process comprising epitaxial deposition on the substrate.

27. The method according to claim 26, wherein the substrate overlies a carrier substrate having a coefficient of thermal expansion substantially different from that of the material constituting the epitaxially grown layer, so as to cause stresses to appear upon a variation of temperature.

28. The method according to claim 1, wherein applying a detachment stress comprises applying on or more of mechanical or chemical stress.

29. The method according to claim 28, wherein applying detachment stress comprises applying stress substantially localized at the level of the layer of precipitates in the liquid phase.

30. The method according to claim 29, wherein applying substantially localized detachment stress comprises inserting a blade.

31. The method according to claim 1 further comprising applying a finishing treatment to the face of the thin film exposed detaching the thin film.

32. The method according to claim 1 further comprising, during or after implantation, applying a heat treatment to encourage the formation of the precipitates.

* * * * *

UNITED STATES PATENT AND TRADEMARK OFFICE
CERTIFICATE OF CORRECTION

PATENT NO. : 7,670,930 B2 Page 1 of 1
APPLICATION NO. : 12/293193
DATED : March 2, 2010
INVENTOR(S) : Aurélie Tauzin et al.

It is certified that error appears in the above-identified patent and that said Letters Patent is hereby corrected as shown below:

On the Title Page

Item (73), replace "S.O.I. Tec-Silicon" with --S.O.I. Tec Silicon--

Signed and Sealed this

Sixth Day of July, 2010

David J. Kappos
*Director of the United States Patent and Trademark Office*